(12) United States Patent
Stollwerck et al.

(10) Patent No.: US 12,437,924 B2
(45) Date of Patent: Oct. 7, 2025

(54) DIELECTRIC MATERIAL FOR A HIGH VOLTAGE CAPACITOR

(71) Applicant: 3M INNOVATIVE PROPERTIES COMPANY, St. Paul, MN (US)

(72) Inventors: Gunther A.J. Stollwerck, Krefeld (DE); Dipankar Ghosh, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 316 days.

(21) Appl. No.: 18/246,527

(22) PCT Filed: Aug. 31, 2021

(86) PCT No.: PCT/IB2021/057957
§ 371 (c)(1),
(2) Date: Mar. 24, 2023

(87) PCT Pub. No.: WO2022/069967
PCT Pub. Date: Apr. 7, 2022

(65) Prior Publication Data
US 2023/0395326 A1 Dec. 7, 2023

Related U.S. Application Data

(60) Provisional application No. 63/086,336, filed on Oct. 1, 2020.

(51) Int. Cl.
*H01G 4/12* (2006.01)
*G01R 15/06* (2006.01)
(Continued)

(52) U.S. Cl.
CPC .......... *H01G 4/1245* (2013.01); *G01R 15/06* (2013.01); *H01G 4/10* (2013.01); *H01G 4/206* (2013.01)

(58) Field of Classification Search
CPC .......... H01G 4/12; H01G 4/1245; H01G 4/10; H01G 4/20; H01G 4/206; G01R 15/06; G01R 15/16
See application file for complete search history.

(56) References Cited

U.S. PATENT DOCUMENTS 5,739,193 A * 4/1998 Walpita .................. H01B 3/301
524/413
6,031,368 A 2/2000 Klippel et al.
(Continued)

FOREIGN PATENT DOCUMENTS

CN 107226697 A 10/2017
CN 107705985 B 9/2019
(Continued)

OTHER PUBLICATIONS

Chao, "BaTiO3—SrTiO3 Layered Dielectrics for Energy Storage", Materials Letters, 2011, vol. 65, pp. 978-981.
(Continued)

*Primary Examiner* — Son T Le

(57) ABSTRACT

A high voltage capacitor for a voltage divider is described that is configured to sense an elevated voltage for medium and high voltage electrical distribution networks. The high voltage capacitor comprises a high voltage electrode, a measurement electrode, and an dielectric material disposed between the high voltage and measurement electrodes, wherein the dielectric material consists essentially of lanthanum oxide-zirconium oxide-titanium oxide (LZT) glass filler disposed in an insulating polymer matrix such that the capacitance of the dielectric material does not vary by more than +/−0.5% in the temperature range of −20° C. to 60° C.

9 Claims, 4 Drawing Sheets

(51) Int. Cl.
*H01G 4/10* (2006.01)
*H01G 4/20* (2006.01)

(56) References Cited

U.S. PATENT DOCUMENTS

| | | | |
|---|---|---|---|
| 7,579,293 | B2 | 8/2009 | Frey et al. |
| 7,658,988 | B2 | 2/2010 | Lin et al. |
| 8,373,215 | B2 | 2/2013 | Tian et al. |
| 8,715,839 | B2 | 5/2014 | De Rochemont |
| 8,901,710 | B2 | 12/2014 | Anderson et al. |
| 10,215,778 | B2 | 2/2019 | Gravermann et al. |
| 10,345,340 | B2 | 7/2019 | Gravermann et al. |
| 10,411,320 | B2 | 9/2019 | Weinmann et al. |
| 10,658,724 | B2 | 5/2020 | Kim et al. |
| 2007/0087929 | A1 | 4/2007 | Park et al. |
| 2009/0073636 | A1 | 3/2009 | Pramanik et al. |
| 2010/0279844 | A1 | 11/2010 | Hackenberger et al. |
| 2017/0030946 | A1* | 2/2017 | Gravermann ...... G01R 19/0084 |
| 2017/0121520 | A1 | 5/2017 | Tan et al. |
| 2017/0174838 | A1 | 6/2017 | Suh et al. |
| 2020/0110114 | A1 | 4/2020 | Mahoney et al. |
| 2023/0092703 | A1 | 3/2023 | Yamaura et al. |

FOREIGN PATENT DOCUMENTS

| | | |
|---|---|---|
| EP | 3882642 A1 | 9/2021 |
| JP | S59-35123 B2 | 8/1984 |
| JP | 2018029156 A | 2/2018 |
| JP | 6870778 B1 | 5/2021 |
| WO | 2016029666 A1 | 3/2016 |
| WO | 2016053790 A1 | 4/2016 |
| WO | 2017103755 A1 | 6/2017 |
| WO | 2018211358 A1 | 11/2018 |
| WO | 2019186607 A1 | 10/2019 |
| WO | 2020016687 A1 | 1/2020 |
| WO | 2021186272 A1 | 9/2021 |

OTHER PUBLICATIONS

Donnay, "Boron Nitride Filled Epoxy with Improved Thermal Conductivity and Dielectric Breakdown Strength", Composites Science and Technology, 2015, Vo. 110, pp. 152-158.

Foeller, "Design of A Bilayer Ceramic Capacitor with Low Temperature Coefficient of Capacitance", Applied Physics Letters, 2016, vol. 109, pp. 082904/1-082904-4.

Ghosh, "Structural and High GHz Frequency EMI (electromagnetic interference) Properties of Carbonyl Iron and Boron Nitride Hybrid Composites", Materials Research Express, 2019, vol. 6, No. 10, pp. 1-12.

Ghosh, "Hybrid Dielectric Thin Films on Flexible Substrates for Embedded Capacitor Applications", IEEE Transactions on Components, Packaging and Manufacturing Technology, Jun. 2016, vol. 6, No. 6, pp. 941-945.

Ghosh, "Tunable High-Quality-Factor Interdigitated (Ba, Sr) TiO3 Capacitors Fabricated on Low-Cost Substrates with Copper Metallization", Thin Solid Films, Feb. 2006, vol. 496, No. 2, pp. 669-673.

Ghosh, "Tunable Microwave Devices Using BST (Barium Strontium Titanate) And Base Metal Electrodes", A dissertation submitted to the Graduate Faculty of North Carolina State University, 2005, 206 Pages.

Heid, "Epoxy/BN Micro- and Submicro-composites: Dielectric and Thermal Properties of Enhanced Materials for High Voltage Insulation Systems", IEEE Transactions on Dielectrics and Electrical Insulation, Apr. 2015, vol. 22, No. 2, pp. 1176-1185.

International Search report for PCT International Application No. PCT/IB2021/057957, mailed on Dec. 23, 2021, 5 pages.

International Search report for PCT International Application No. PCT/US2021/049650, mailed on Jan. 18, 2022, 5 pages.

Kovacevic, "Design of Capacitive Voltage Divider for Measuring Ultrafast Voltages", Electrical Power and Energy Systems, 2018, vol. 99, pp. 426-433.

Lee, "Multi-Functional Epoxy/SrTiO3 Ceramic Powder Embedded Capacitor Films (ECFs) for Organic Substrates", Electronics Packaging Technology Conference, 2006, pp. 549-552.

Liu, "High Dielectric Constant Composites Controlled by A Strontium Titanate Barrier Layer on Carbon Nanotubes Towards Embedded Passive Devices", Chemical Engineering Journal, 2019, vol. 373, pp. 642-650.

Sarkarat, "Improved Thermal Conductivity and AC Dielectric Breakdown Strength of Silicone Rubber/BN Composites", Composites Part C: Open Access 2, 2020, pp. 100023/1-100023/6.

Tsekmes, "AC Breakdown Strength of Epoxy-Boron Nitride Nanocomposites: Trend & Reproducibility", 2015 Electrical Insulation Conference (EIC), Jun. 7-10, 2015, Seattle, Washington, USA, pp. 446-449.

Zhou, "Synthesis and Dielectric Properties of Printable Strontium Titanate/Polyvinylpyrrolidone Nanocomposites", Materials Research Express, 2019, vol. 6, pp. 0950c6/1-0950c6/7.

* cited by examiner

DIELECTRIC MATERIAL FOR A HIGH VOLTAGE CAPACITOR

CROSS REFERENCE TO RELATED APPLICATIONS

This application is a national stage filing under 35 U.S.C. 371 of PCT/IB2021/057957, filed Aug. 31, 2021, which claims the benefit of Provisional Application No. 63/086,336, filed Oct. 1, 2020, the disclosures of each of which are incorporated by reference herein their entireties.

BACKGROUND OF THE INVENTION

Field of the Invention

The present invention relates to a high voltage capacitor for use in a sensor for high voltage separable connectors, wherein the high voltage capacitor has a low temperature coefficient of capacitance (TCC) and a small change in capacitance with temperature and in particular to the dielectric material for a high voltage capacitor.

Background

As electrical power distribution becomes more complex through the advent of renewable energy, distributed generation, and the adoption of electric vehicles, intelligent electrical distribution and associated electrical sensing is becoming more useful and even necessary. Useful sensing may include voltage, current, and the time relationship between voltage and current at various locations within a power distribution network.

Traditionally, the power has been generated at a central location, and then distributed radially from the generation facility. As the development of the power grid matures, and more renewable energy is involved, the power flow in the distribution grid becomes less obvious, i.e., no longer simply flowing away from primary generation stations. Too, customers are becoming much more aware of power quality in regards voltage, harmonics, real/imaginary power magnitudes, etc.

Many existing relatively high voltage transformers and switchgears have a dedicated space for cable accessories, particularly in higher voltage applications (for example, 5 kV to 69 kV, or higher). Many of these transformers and switchgear are of a variety referred to in the power utility industry as dead-front. Dead-front means there are no exposed relatively high voltage surfaces in the connection between a power cable and the transformer or switchgear. Such cable accessory connections are sometimes referred to as elbows, T-bodies, or separable connectors. Such separable connectors have a front cavity to receive a protruding portion of the electrical equipment and a connection to high or medium voltage that can be mechanically and electrically connected to connection element, such as a bushing or a threaded stud, which is accessible through an opposed rear cavity of the separable connector. After installation on the electrical equipment, an insulating plug is placed in the rear cavity to insulate the connection element.

Elements of a voltage sensor for measuring the voltage of the connection element of a separable connector—and thereby the voltage of the power cable—can be integrated into the insulation plug, making it a "sensored insulation plug". A sensored insulation plug is described, for example, in the U.S. Pat. No. 6,031,368.

The sensored insulation plug may include a capacitive voltage divider to accurately measure the voltage of the connection element. The voltage divider will typically include a high voltage portion and a low voltage portion and can be characterized by a dividing ratio that is constant with respect to time and temperature. The high voltage portion of such a voltage divider can be a plurality of individual capacitors connected in series or a single, low capacitance, high voltage capacitor comprising a dielectric material disposed between a pair of electrodes.

A capacitor's capacitance is based on the spacing between and the geometry of the electrodes and the permittivity values of the dielectric material. The capacitance density of the dielectric materials can be increased by the addition of high permittivity dielectric filler materials at relatively high loadings. High loading of dielectric filler materials into the dielectric material often has a negative impact on mechanical properties, processing, stability of resulting capacitance with temperature. The change of capacitance as a function of temperature are described by the "temperature coefficient of capacitance" or TCC of the material. A material's TCC indicates the rate of change in capacitance as a function of temperature within a specified temperature range. Conventional dielectric composite capacitor materials have been developed which have a change in capacitance of from as low as ±5% over the use temperature range of the capacitor. However, a need exists for capacitor materials having a very low change in capacitance in the range of from about ±0.5% over the use temperature range of a high voltage capacitor that has a capacity of more than 10 pF.

SUMMARY

In a first embodiment, the present invention relates to a high voltage capacitor for a voltage divider that is configured to sense an elevated voltage for medium and high voltage electrical distribution networks. The high voltage capacitor comprises a high voltage electrode, a measurement electrode, and an dielectric material disposed between the high voltage and measurement electrodes, wherein the dielectric material consists essentially of lanthanum oxide-zirconium oxide-titanium oxide (LZT) glass filler disposed in an insulating polymer matrix such that the capacitance of the dielectric material does not vary by more than +/−0.5% in the temperature range of −20° C. to 60° C.

In a second embodiment, the present invention relates to a sensor that comprises a voltage divider at least partially encapsulated in an insulating polymer body wherein the voltage divider comprises a high voltage capacitor and a low voltage capacitor connected to the high voltage capacitor in series. The high voltage capacitor comprises a high voltage electrode, a measurement electrode, and an dielectric material disposed between the high voltage and measurement electrodes, wherein the dielectric material consists essentially of lanthanum oxide-zirconium oxide-titanium oxide (LZT) glass filler disposed in an insulating polymer matrix such that the capacitance of the dielectric material does not vary by more than +/−0.5% in the temperature range of −20° C. to 60° C.

DETAILED DESCRIPTION OF THE EMBODIMENTS

Figure 1A:
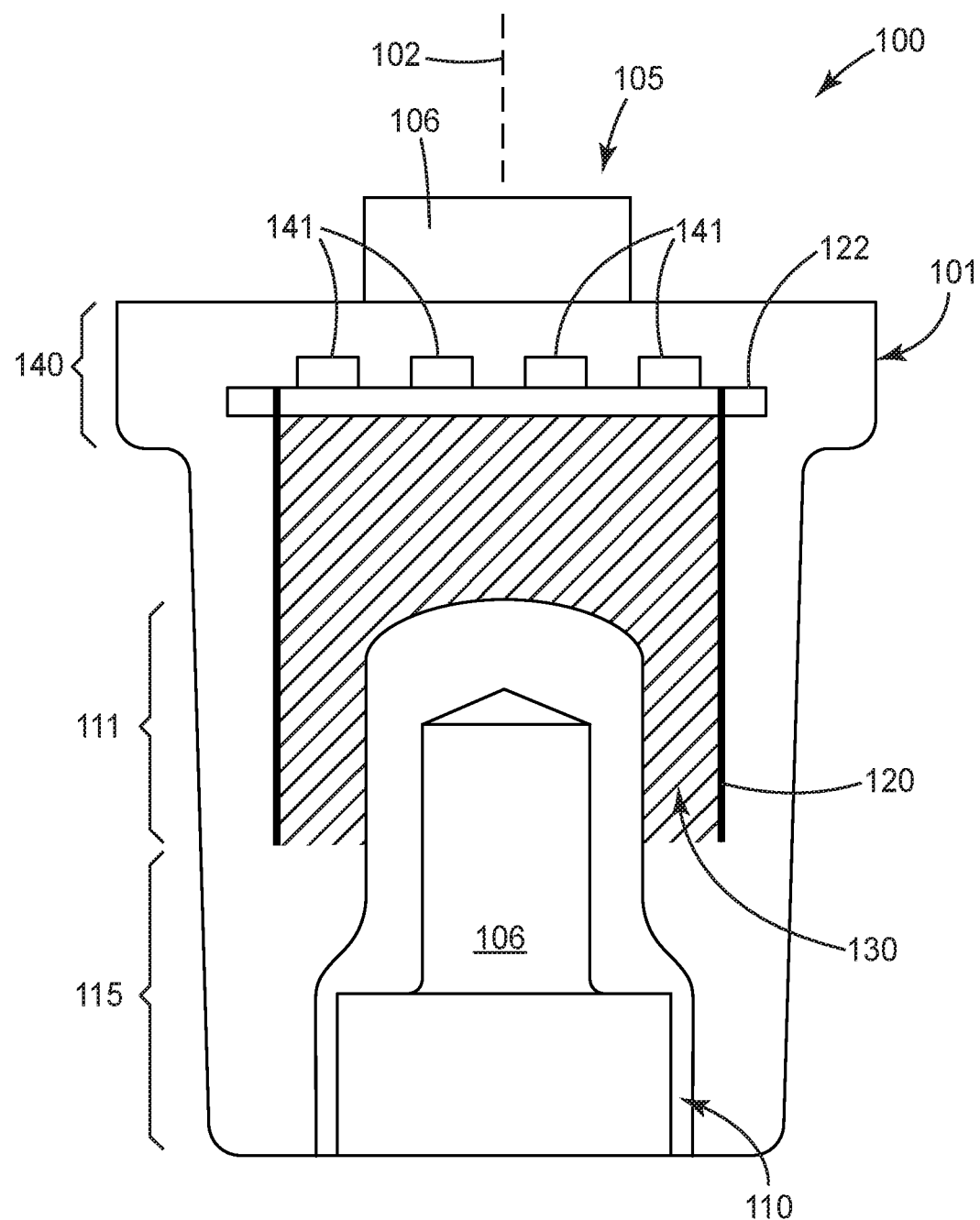
FIG. 1A is a schematic cross-section of a first sensored insulation plug having an exemplary primary capacitor according to an aspect of the invention.

In the following detailed description, reference is made to the accompanying drawings, which form a part hereof, and in which is shown by way of illustration specific embodiments in which the invention can be practiced. In this regard, directional terminology, such as "top," "bottom," "front," "back," "forward," etc., is used with reference to the orientation of the Figure(s) being described. Because components of embodiments of the present invention can be positioned in a number of different orientations, the directional terminology is used for purposes of illustration and is in no way limiting. It is to be understood that other embodiments can utilize structural or logical changes without departing from the scope of the present invention. The following detailed description, therefore, is not to be taken in a limiting sense, and the scope of the present invention is defined by the appended claims.

The present disclosure describes a high voltage, low capacitance capacitor for use in a sensored insulation plug as a component of a voltage sensor, such as, for example, a primary capacitor or a high voltage portion of a voltage divider of a voltage sensor. The component, for example the primary capacitor, may be embedded (partially or completely) in a plug body of the sensored insulation plug. In particular, a sensored insulation plug may be an insulation plug comprising a high voltage capacitor of a voltage-dividing voltage sensor for sensing an elevated voltage.

The present disclosure relates to voltage sensing devices for use in medium-voltage (MV) or high voltage (HV) power distribution networks in which electrical power is distributed via HV/MV power cables, transformers, switchgears, substations etc. with currents of tens or hundreds of amperes and voltages of tens of kilovolts.

The term "high voltage" as used herein means a voltage equal to or greater than a high voltage threshold and may be referred to herein as "elevated voltage". The high voltage threshold may be based on a standard, jurisdictional requirement, or end-user requirement that applies to the particular system being described. For example, high voltage may refer to operating at about the voltage rating defined in a standard, such as the Institute of Electrical and Electronics Engineers (IEEE) Standard 386 (2016) for separable insulated connector systems for power distribution systems rated 2.5 kV through 35 kV (classified as phase-to-phase root-mean-square, or rms), which is incorporated herein by reference for any and all purposes. Depending on the application, the high voltage threshold may be equal to or greater than about 2.5 kV, about 3 kV, about 5 kV, about 15 kV, about 25 kV, about 28 kV, about 35 kV, about 69 kV, about 72 kV or more (classified as phase-to-phase rms). The high voltage threshold is sometimes subdivided into a medium voltage (MV) range between 1 kV to 72 kV and a high voltage (HV) range of more than 72 kV.

The term "low voltage" as used herein means a voltage that is less than the high voltage. Low voltage may be defined at or below a low voltage threshold. The low voltage threshold and the high voltage threshold may be the same threshold or a different threshold. A low voltage may be a fraction, or ratio less than 1, of a high voltage. The low voltage may be defined by a threshold fraction, or ratio (for example, less than or equal to about 1:100). Unless otherwise stated in the disclosure herein, low voltage is described using phase-to-ground rms.

The term "separable connector" as used herein means a connection or interface for a high voltage system that can be readily established or broken by engaging or separating the connection at an operating interface. Separable connectors may be fully insulated and shielded and used to terminate and insulate a power cable, insulate another electrical component, or connect an insulated power cable to electrical apparatus, other power cables, or both. Separable connectors may be connected to transformers or switchgears. Some separable connectors may be used for dead front transformers and switchgears, which refers to having no exposed high voltage surfaces in the connector between a power cable and the transformer or switchgear in the power utility industry. Non-limiting examples of separable connectors include elbow separable insulated connectors and tee separable insulated connectors (for example, a T-Body).

The term "connection" as used herein means an interface, a connector, or other structure used to electrically or mechanically couple components together. For example, a connection may include a plug or socket, a wire, a cable, a conductor on a substrate, a piece of solder, a conductive via, or other similar electrical or mechanical coupling.

The terms "coupled" or "connected" refer to elements being attached to each other either directly (in direct contact with each other) or indirectly (having one or more elements between and attaching the two elements).

A sensored insulation plug may include a capacitive voltage divider to accurately measure the voltage of the connection element. The voltage divider will typically include a high voltage portion and a low voltage portion and can be characterized by a dividing ratio that is constant with respect to temperature and time. The high voltage portion of such a voltage divider can be a plurality of individual capacitors connected in series or a single, high voltage capacitor. The high voltage portion of the voltage divider is the portion that is electrically arranged between a signal contact, at which a divided voltage can be picked up, and the elevated voltage which is to be sensed. The low-voltage portion of the voltage divider is the portion that is electrically arranged between that signal contact and electrical ground.

In an exemplary aspect, the high voltage portion will comprise a single, high voltage capacitor or primary capacitor that comprises a dielectric material disposed between a pair of electrodes. The dielectric material comprises the dielectric material comprises lanthanum oxide-zirconium oxide-titanium oxide (LZT) glass beads or powders disposed in an insulating polymer matrix such that the capacitance of the dielectric does not vary by more than +/−0.5% in the temperature range of −20° C. to 60° C. and the high voltage capacitor is capable of withstand voltage levels of at least 50 kV, preferably at least 70 kV and more preferably at least 85 kV. The exemplary primary capacitor should have a voltage rating/operating voltage of at least 12 kV, preferably 18 kV for its expected lifetime (i.e. 30 years of sustained use). The term "withstand voltage" indicates the maximum voltage that can be resisted for an allotted time (e.g. minutes) before breakdown. The term "breakdown voltage" is the minimum voltage at which a dielectric material is able to conduct electricity. European Committee for Electrotechnical Standardization (CENELEC) Standard HD 629.1 requires a breakdown strength of more than 85 kV for accessories used on power cables having a voltage rating of 18 kV.

In an exemplary embodiment, the dielectric material should have a temperature coefficient of capacitance (TCC) of less than +/−125 ppm, preferably less than +/−95 ppm, more preferably less than +/−50 ppm.

The exemplary primary capacitor is used in a capacitive voltage divider that is electrically connected between the connection element on elevated voltage and electrical ground, for sensing the elevated voltage of the connection element of the separable connector. In an exemplary embodiment, a high voltage electrode of the primary capacitor is not only electrically, but also mechanically connected to the connection element of the separable connector. This mechanical connection is an electrically conductive connection. This mechanical connection may be a direct mechanical connection, i.e. a portion of the high voltage electrode is connected to the connection element without any intermediate element.

In some embodiments, this connection between the voltage divider and connection element of the separable connector may be an indirect mechanical connection, i.e. a portion of the high voltage electrode is connected to the connection element via an intermediate element, which is electrically conductive. The sensed insulation plug may thus further comprise an intermediate element which is operable to mechanically and electrically connect the high voltage electrode with the connection element. Such an intermediate element may be, for example, a contact piece. Such a contact piece may be connectable to the connection element of the separable connector via a conductive threaded stud that is threadedly connected to the connection element on one side and that can, on the other side, be threadedly engaged with the connection element of the sensed insulation plug.

An exemplary primary capacitor is shown in FIG. 1A as part of an exemplary sensed insulation plug 100. The sensed insulation plug has a plug body 101 of an electrically insulating hardened resin, a primary capacitor that comprises a high voltage electrode 110, a sensing or measurement electrode 120 and a dielectric material 130 disposed between the high voltage electrode and the measurement electrode.

Figure 2:
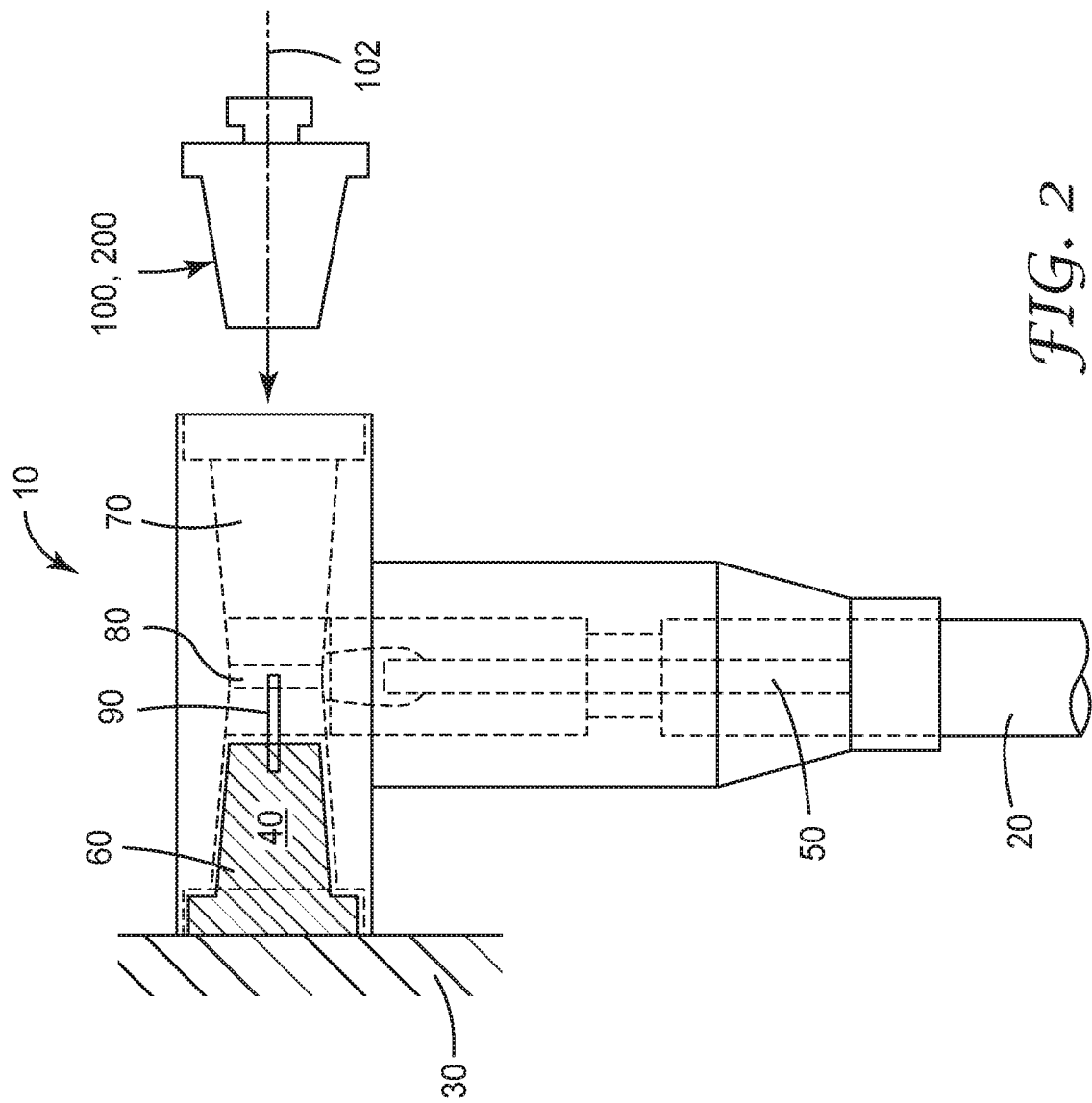
FIG. 2 is a schematic drawing of a separable connector and an exemplary sensored insulation plug according to an aspect of the invention.

The high voltage electrode 110 has an electrode portion 111 and an engagement portion 115 for mechanical engagement and electrical connection with connection element 80 of the separable connector 10, shown in FIG. 2. High voltage electrode 110 is generally made of a conductive metal. The electrode portion 111 serves as the high voltage electrode 110 of the primary capacitor. In an exemplary aspect, the engagement portion 115 and the electrode portion 111 are formed as a single piece of metal. In an exemplary embodiment, the high voltage electrode 110 is rotationally symmetric about axis 102.

Engagement portion 115 has a threaded recess to mechanically and electrically engage connection element 80 of the separable connector 10. In use, engagement portion 115 and electrode portion 111 are on the elevated voltage of the connection element 80 of the separable connector 10.

The measurement electrode 120 has a generally hollow cylindrical shape such that the electrode portion 111 of the high voltage electrode 110 extends into the hollow interior of the measurement electrode such that the high voltage electrode and the measurement electrode are disposed in a concentric, spaced apart arrangement. In order to reduce the risk of electrical discharge between the measurement electrode and the high voltage electrode, it is generally advisable to keep the electrodes at a distance from each other, because smaller distances are more likely to allow for discharges. The measurement electrode of the primary capacitor may be connected to, or formed with, other components, e.g. components for support or electrical or mechanical connection of the measurement electrode, to form a measurement electrode assembly. Within a measurement electrode assembly, the measurement electrode is the element that is arranged opposite to the high voltage electrode and that determines, in combination with the high voltage electrode, the capacitance of the primary capacitor.

The measurement electrode of the primary capacitor is embedded in the plug body, such that a portion of the measurement electrode or the entire measurement electrode is in surface contact with the insulating polymer material of the plug body 101.

The measurement electrode may be electrically connected, or connectable, to a low-voltage capacitor, such that the primary capacitor and the low-voltage capacitor form a voltage divider for sensing the elevated voltage of a connection element of a separable connector. In the exemplary embodiment shown in FIG. 1A, the measurement electrode 120 may be electrically connected to a printed circuit board 122 wherein the printed circuit board can comprise at least one low voltage capacitor 141 of the low voltage portion of the voltage divider mounted thereon. In an alternative embodiment the low voltage portion of the voltage divider can be located external to plug body 101.

Dielectric material 130 is arranged between high voltage electrode 110 and measurement electrode 120. Having a dielectric material between the high voltage and measurement electrodes increases the capacitance of the primary capacitor, as compared to the case when air as the dielectric material and makes the capacitor suitable for use with high and medium voltages. More specifically the dielectric material is arranged between at least a portion of the measurement electrode and at least a portion of the high voltage electrode. In certain embodiments it is arranged between the measurement electrode and the high voltage electrode. In certain embodiments it is arranged between a portion of the measurement electrode and the high voltage electrode.

Because the measurement electrode and the high voltage electrode of the primary capacitor are on significantly different voltages, a strong electric field will exist between them. Advantageously the dielectric material is therefore a continuous material, i.e. free of voids, because air-filled voids in the dielectric material can increase the risk of partial discharge through these voids.

The dielectric material will have a continuous insulating polymer matrix and a LZT glass filler dispersed in the insulating polymer matrix. In some embodiments, the material for the polymer matrix should be a low viscosity liquid (e.g. less than 2000 mPas measured according to International Standard ISO 2555) prior to cure at the casting temperature and have a high glass transition temperature (e.g. greater than 100° C. as measured dynamic scanning calorimetry) after being cured. Additionally, the exemplary material should have a low intrinsic TCC (e.g. less than +/−125 ppm, preferably less than +/−95 ppm, more preferably less than +/−50 ppm), and a high voltage withstand rating (greater than 50 kV, preferably greater than 70 kV or more preferably greater than 85 kV as determined by CENELEC Standard HD 629.1). The insulating polymer matrix may comprise a curable epoxy resin, a curable polyurethane resin, a curable silicone resin or mixtures thereof.

Curable epoxy resins as described herein comprise the base resin, the curative material that reacts with the base resin and a catalyst if required. Examples of suitable base resins for the curable epoxy resins include liquid resins comprising phenol novolak epoxies, epoxies having an aliphatic or aromatic hydrocarbon backbone derived from bisphenol A or bisphenol F, butadiene-acrylic modified epoxies, or combinations thereof. Exemplary epoxy materials for the insulating polymer matrix include EPIKOTE 807 epoxy resin available from Hexion, (Duisburg, Germany) and 3M™ Scotchcast™ Electrical Resin 250 available from 3M Company (St. Paul, MN, USA).

In an exemplary aspect, an anhydride curative may be selected to react with the epoxy resin. Exemplary anhydrides can be selected from for example: succinic anhydride, maleic anhydride, phthalic anhydride, hexahydrophthalic anhydride, methylhexahydrophthalic anhydride, trimellitic anhydride, hydrogenated trimellitic anhydride, 1,2-cyclopentanedicarboxylic anhydride, tetrahydrophthalique anhydride, methyl tetrahydrophthalic anhydride, 5-norbornene-2,3-dimethyl hydrogenated 5-norbornene-2,3-dicarboxilic anhydride, methyl-5-norbornene-2,3-dicarboxylic anhydride, hydrogenated methyl-5-norbornene-2,3-dicarboxylic anhydride or combinations thereof. Either pure anhydride or acid anhydride can be used or mixtures of at least two of them. Exemplary commercially available products include Epikure 866, Epikure 854, Epikure 868 or Epikure 878 (all of which are available from Hexion).

In some embodiments, a tertiary amine-, quaternary ammonium-, tertiary phosphine-, imidazole-, and azabicyclo compound-curing accelerator may be used as a catalyst. An exemplary commercially available product is Epikure Catalyst 03932 (available from Hexion).

The insulating polymer matrix, which includes the epoxy resin, curative and catalyst, comprises from about 40 vol. % to about 70 vol. % based on the total volume of the dielectric material, preferably from about 45 vol. % to about 60 vol. %.

Useful LZT glass fillers are described in in U.S. Pat. No. 7,579,293, incorporated herein by reference. LZT glass can be in the form of a powder, microspheres, or beads. The LZT glass bead fillers can have a particle size which preferably ranges from at least 10 micrometers, (e.g., at least 50 micrometers, at least 100 micrometers, at least 150 micrometers). In one exemplary aspect, the LZT glass beads or microspheres can have a diameter from about 20 microns to about 150 microns. In an alternative aspect, the LZT glass can be ground into a powder having a mean particle side that is less than 20 microns, or even sub-micron size (less than 0.5 microns).

For optimal effectiveness, the filler may be composed entirely of pure LZT beads or powders, keeping in mind that other elements or compounds may also be present as impurities in such powders. In other cases, the powders may not be pure LZT (as in the case of doped LZT).

When doped LZT is used, the dopant can be any suitable dopant, such as one or more of Y, Hf, Gd, and other transition metal elements. When the LZT is doped, the doping levels can vary widely, such as from 10 ppm or 100 ppm to 0.1 wt. % of the $SrTiO_3$ or 5 wt. % of the LZT.

Generally, LZT glass beads are used that are substantially amorphous yet can contain some crystallinity. The compositions preferably form clear, transparent glass microspheres when quenched. Upon further heat treatment, the beads can develop crystallinity in the form of a glass-ceramic structure, i.e., microstructure in which crystals have grown from within an initially amorphous structure, and thus become glass-ceramic beads. Upon heat treatment of quenched beads, the beads can develop crystallinity in the form of a glass-ceramic structure at the nano scale level, i.e., microstructure in which crystals less than about 100 nanometers in dimension have grown from within an initially amorphous structure, and subsequently become glass-ceramic beads. A nanoscale glass-ceramic microstructure is a microcrystalline glass-ceramic structure comprising nanocrystalline regions.

In some embodiments, small amounts of ceramic boron nitride (BN) may be added to increase thermal conductivity or dielectric breakdown strength of the dielectric material. Also, additives such as colorants, dispersants (e.g. silane agents) can also be used to improve the dispersion of the ceramic fillers in the polymer matrix.

The dielectric fillers comprise from about 30 vol. % to about 60 vol. % based on the total volume of the dielectric material, preferably from about 40 vol. % to about 55 vol. %.

The dielectric material should have a relative permittivity Cr of at least about 4 to provide an adequate capacitance to the primary capacitor. Preferably, the dielectric material has a relative permittivity of between 4 and 10, more preferably of between 4 and 8. Additionally, the dielectric material should have a TCC of +/−125 ppm, preferably +/−95 ppm, more preferably less than +/−50 ppm.

In some embodiments, the dielectric material of the primary capacitor is the same as the insulating polymer material of the plug body. Using the same material to form the dielectric material avoids the use of a second material for the dielectric material, and thereby avoids interfaces between the plug body material and the dielectric material, making the sensored insulation plug more reliable and more cost-effective to manufacture.

The primary capacitor may be the only impedance element of the high voltage portion of the voltage divider. In other words, there may be no other capacitor(s) and no other impedance elements electrically arranged between the elevated voltage and the signal contact of the voltage divider. Independent of the number of capacitors in the voltage divider, the primary capacitor may be the first impedance element in an electrical chain of impedance elements of the voltage divider. In this chain, the primary capacitor may be arranged electrically at the end of the chain and adapted to be electrically connected directly with the elevated voltage. The primary capacitor would thus be the impedance element of the voltage divider which "sees" the full elevated voltage on its input side.

As mentioned previously, the exemplary primary capacitor can be used in the high voltage portion of a voltage divider while the low voltage portion of the voltage divider can comprise one or more low voltage capacitors 141. For elevated voltages of about 50 kV, frequencies of about 50 Hz and target dividing ratios of about 5000, a suitable capacitance of the primary capacitor is in the order of 30 pF. When designing the primary capacitor, further factors like the permittivity of the dielectric material and the geometry of the electrodes should be considered, as is generally known.

In some embodiments, it may be desirable to keep the TCC of the voltage divide or sensor within a prescribed range. An exemplary voltage divider will comprise the exemplary high voltage capacitor described herein in the high voltage portion of the divider and one or more low voltage capacitors in the low voltage portion. A conventional NPO grade low voltage capacitor will typically have a TCC of +/−30 ppm/K, so if, for example, a voltage divider is desired that has a total TCC of +/−125 ppm/K, the high voltage capacitor should have a TCC of less than about 95 ppm/K to keep the change in capacitance of the voltage divider within +/−0.5% from −20° C. to 60° C.

In another embodiment, it may be desirable to keep the change in capacitance of a sensor or voltage divide within +/−0.2% over the temperature range of −20° C. to 60° C. Selecting a NPO low voltage capacitor with a TCC of +/−30 ppm/K, means that the high voltage capacitor needs to have a TCC of less than or equal to +/−20 ppm/k to produce a voltage divider or sensor with a total TCC or less than or equal to +/−50 ppm to achieve the desired 0.2% change in capacitance.

Plug body 101 of sensored insulation plug 100 may have a generally rotationally symmetric outer shape. In order to be usable with many existing separable connectors, such as separable connector 10 shown in FIG. 2, the plug body may have a generally frustro-conical outer shape, such that it can fill a frustro-conical rear cavity 70 of the separable connector without leaving a gap between the inner surface of the rear cavity and the outer surface of the plug body. The plug body generally determines the outer shape of the sensored insulation plug.

In some embodiments, plug body can be mechanically rigid, have a high dielectric material strength, and/or have minimal variation of its relative permittivity with changes in temperature over the operating temperature range. The material of the plug body should have minimal moisture absorption and should not deteriorate (age) over time. The insulating material may be, for example, a hardened or cured epoxy resin or a hardened or cured mixture of an epoxy resin with other materials, such as fillers, or a hardened or cured polyurethane resin or a hardened or cured mixture of a polyurethane resin with other materials, such as fillers.

Useful fillers are, for example, $SiO_2$ or $Al_2O_3$ or other electrically insulating inorganic materials. Alternatively, the insulating material may be or may comprise, for example, a ceramic material.

In some embodiments, plug body 101 can be made of the same dielectric material that is used to form the primary capacitor.

The sensored insulation plug 100 can be inserted into the rear cavity 70 of separable connector 10 by moving it axially into the rear cavity 70 where it can be threadedly engaged with threaded stud 90—and thereby electrically connected—with the connection element 80 on elevated voltage. The geometry of the sensored insulation plug 100 is adapted to conform to ANSI/IEEE standard 386 (e.g. ANSI/IEEE standard 386-2016, published 14 Oct. 2016) or British Standards Institute (BSI) BS EN50180 (2015). Conformance to an industry standard, although not a requirement for insulation plugs, may generally help obtain compatibility with a greater number of separable connectors.

Sensored insulation plug 100 includes a lug 105 that is fixable connected to and may be partially embedded in plug body 101. The lug includes a protruding portion 106, extending from the plug body 140 and is therefore externally accessible. The protruding portion 106 can have a hexagonal shape, so that torque can be applied to the lug with a wrench. The torque can be transmitted into the entire sensored insulation plug 100, to enable the plug to be threadedly engaged with the threaded stud 90 of the separable connector 10. The expression "partially embedded in the plug body" as used herein refers to being at least partially surrounded by portions of the plug body.

In one embodiment, sensored insulation plug 100 can be formed via a vacuum molding process. The electrodes can be prepositioned in a mold for plug body 101. The exemplary dielectric material can then be added to the mold and cured to form the plug body. When using this manufacturing method, it is important that the viscosity of the uncured dielectric material be low enough to flow into the mold and around the high voltage and measurement electrodes without creating any voids or air gaps. The presence of voids of air gaps may lead to an unwanted partial discharge event when the high voltage electrode is subjected to an elevated voltage.

Where the sensored insulation plug is to be threadedly engaged with the connection element of the separable connector, the insulation plug may have to be turned about its axis for engagement. Thus, the lug may be hexagonally, octagonally, square, or rectangularly shaped, for engagement by a wrench or another tool, so that torque applied by the tool on the insert turns the entire sensored insulation plug. Hence, in certain embodiments, the externally accessible portion of the lug has a polygonal shaped such that external torque can be applied to the sensored insulation plug via the lug.

As mentioned previously, a voltage divider can comprise the exemplary primary capacitor in the high voltage portion and a low voltage portion comprising one or more low-voltage capacitors. The low-voltage capacitors may be disposed within or embedded in the plug body of the sensored insulation plug. Alternatively, the low-voltage capacitor may be arranged external to the sensored insulation plug, such as is described in U.S. Published Patent Appl. No. 2020/0110114A1, incorporated herein by reference. It may be remote from the sensored insulation plug. The measurement electrode of the primary capacitor may be electrically connected, or connectable, to the low-voltage capacitor, e.g. by a wire.

Figure 1B:
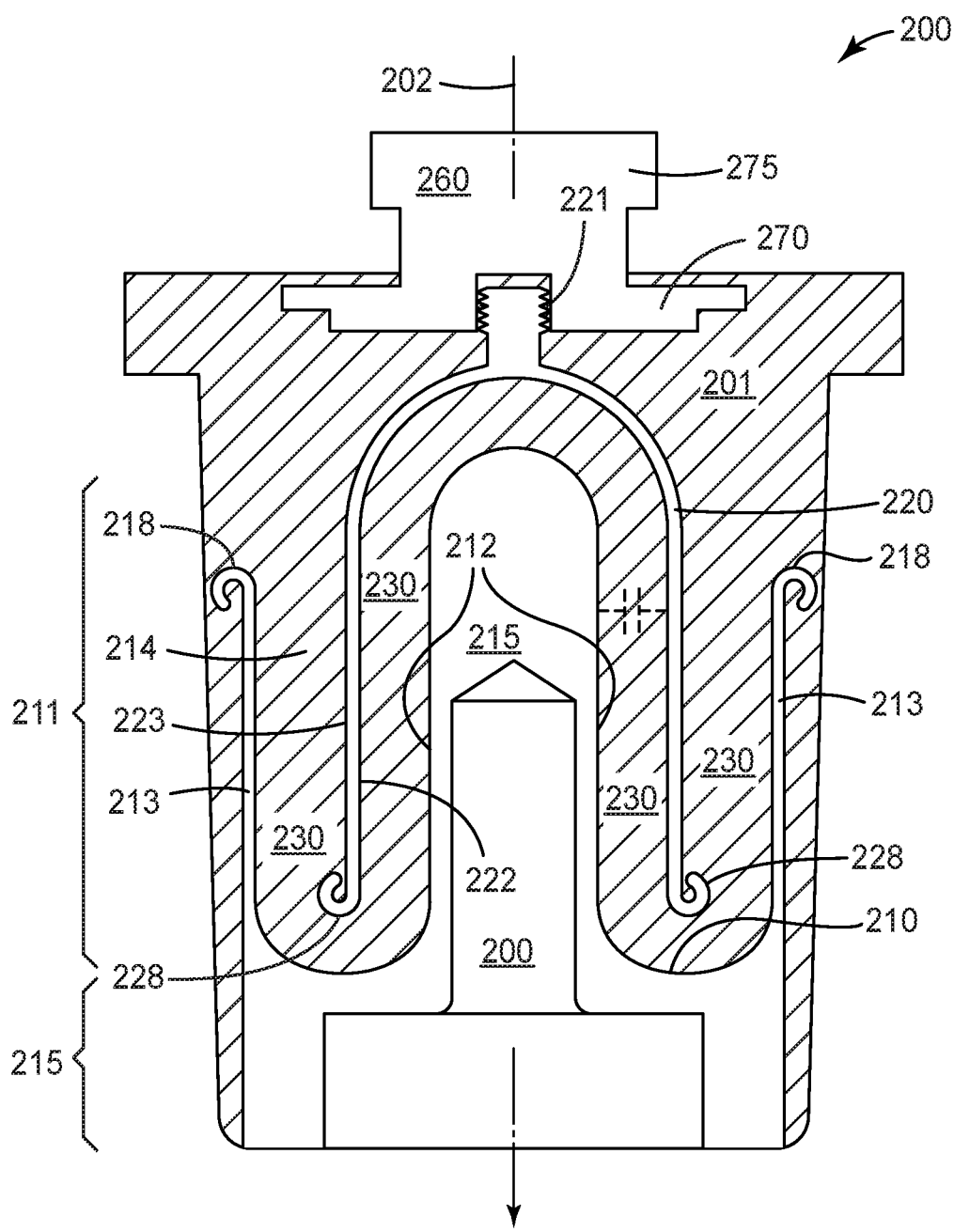
FIG. 1B is a cross section of a second sensored insulation plug having an exemplary primary capacitor according to an aspect of the invention.

FIG. 1B illustrates a second sensored insulation plug 200 having an exemplary primary capacitor according to an aspect of the invention. Sensored insulation plug 200 is described more fully in EP Appl. No. 20163695.8, which is incorporated by reference in its entirety. Sensored insulation plug 200 comprises a plug body 201 of an electrically insulating hardened resin and a primary capacitor formed by a high voltage electrode 210 and a measurement or sensing electrode 220, with its dielectric material being formed by a portion 230 of the insulating material of the plug body.

High voltage electrode 210 has an electrode portion 211 and an engagement portion 215 for mechanical engagement and electrical connection with connection element 80 of the separable connector 10 shown in FIG. 2. In use, engagement portion 215 and electrode portion 211 are on the elevated voltage of the connection element 80 of the separable connector 10.

The electrode portion 211 serves as the high voltage electrode 210 of the primary capacitor, which is rotationally symmetric about axis 202. The high voltage electrode 210 has a radially inner portion 212 and a radially outer portion 213 forming a trough 214 between them. The trough 214 is of a generally toroidal shape, due to the rotational symmetry of the sensored insulation plug 200 about a symmetry axis 202. The trough is completely filled with the insulating material of the plug body 201. The trough extends generally for a full 360° perimeter around a central portion 215 of the high voltage electrode 210. In an exemplary aspect, the distal edge 218 of the high voltage electrode 210 is curled radially outwards for electrical stress control at the edge 218.

The "depth" of the trough is determined by the length over which the radially inner portion and the radially outer portion of the high voltage electrode extend axially such that they are generally parallel to one another and facing one another. The deeper the trough, the more space is available to accommodate a larger portion of the measurement electrode within the trough. The larger the portion of the measurement electrode that can be accommodated in the trough, the greater the capacitance of the primary capacitor.

The "width" of the trough as the radial distance between the radially inner portion and the radially outer portion of the high voltage electrode. In general, increasing the width of the trough results in a smaller capacitance of the high voltage capacitor. Thus, a narrower trough is therefore generally preferred where a larger capacitance is desired.

In this exemplary embodiment shown in FIG. 1B, the insulating material that forms the plug body also serves as the dielectric material for the primary capacitor and can have the composition of dielectric material 130 described previously.

The measurement electrode 220 is generally of a bell shape in the depicted embodiment and comprises a threaded support prong 221 which connects the measurement electrode 220 mechanically and electrically with a conductive insert 260. The insert 260 has an embedded portion 270, embedded in the plug body 201, and a protruding portion 275, protruding from the plug body 201 and therefore externally accessible. The protruding portion of the insert 260 can have a hexagonal shape, so that the torque of a wrench can be transmitted into the entire sensored insulation plug 200, which can thereby be threadedly engaged, via a stud (not shown), with the connection element 80 of the separable connector 10. The distal edge 228 of the measurement electrode 220 is curled radially outwards for electrical stress control at the edge 228.

In the embodiment shown in FIG. 1B, the voltage of the measurement electrode 220 can be picked up at the conductive insert 260, and via the insert 260 the primary capacitor can be electrically connected to a low-voltage capacitor, e.g. by a wire, such that the primary capacitor and the low-voltage capacitor form a capacitive voltage divider for sensing the elevated voltage of the connection element 80 of the separable connector 10 into which the sensored insulation plug 200 is inserted.

A lower portion of the measurement or sensing electrode 220 distal from the support prong 221 is arranged in the trough 214 such that it is embedded in the portion 230 of the insulating material of the plug body 201 between the radially inner portion 212 and a radially outer portion 213 of high voltage electrode 210, thus providing that a radially outer surface portion 223 of the sensing electrode 220 facing the radially outer portion 213 of the high voltage electrode 210, and a radially inner surface portion 222 of the sensing electrode 220 facing the radially inner portion 212 of the high voltage electrode 210. This double-facing arrangement increases the overall capacitance of the primary capacitor considerably. In an exemplary aspect, the overall capacitance of the primary capacitor illustrated in FIG. 1B is about 35 pF, while other capacitor geometries were measured to provide capacitances of up to 25 pF only. The higher capacitance of the primary capacitor can reduce the impact of certain unavoidable parasitic capacitances and thereby allows for a higher accuracy in the sensing of the elevated voltage of the separable connector 10.

The toroidal trough-shape of the high voltage electrode and the arrangement of the measurement electrode between two opposed portions of the high voltage electrode maximize the area of overlap between the electrodes and thereby maximize the capacitance of the primary capacitor.

In certain embodiments, the high voltage electrode 210 is generally axially symmetric shape relative to a symmetry axis 202 defining axial and radial directions. The radially inner portion 212 and a radially outer portion 213 of the high voltage electrode 210 are electrically connected with each other and are thus on the same electrical potential and in use, both portions are on elevated voltage.

The measurement electrode of the primary capacitor may be electrically connected, or connectable, to a low-voltage capacitor, such that the primary capacitor and the low-voltage capacitor form a voltage divider for sensing the elevated voltage of a connection element of a separable connector.

The primary capacitor of the sensored insulation plugs described previously are operable as high voltage capacitors in a voltage divider for sensing the elevated voltage. The primary capacitor may be the only impedance element of the high voltage portion of the voltage divider (i.e. there may be no other capacitor(s) and no other impedance elements electrically arranged between the elevated voltage and the signal contact of the voltage divider).

The voltage divider may be a capacitive voltage divider. In other words, both its high voltage portion and its low-voltage portion consist of one or more capacitors, respectively, and are free of other impedance elements, such as resistors or inductances. In other embodiments the voltage divider is a mixed voltage divider, in which the high voltage portion comprises the exemplary primary capacitor and also an inductor or a resistor, and/or in which the low-voltage portion comprises a capacitor, an inductance or a resistor.

The high voltage portion of the voltage divider is the portion that is electrically arranged between a signal contact, at which a divided voltage can be picked up, and the elevated voltage which is to be sensed. The low-voltage portion of the voltage divider is the portion that is electrically arranged between that signal contact and electrical ground.

Independent of the number of capacitors in the voltage divider, the primary capacitor may be the first impedance element in an electrical chain of impedance elements of the voltage divider. In this chain, the primary capacitor may be arranged electrically at the end of the chain and adapted to be electrically connected directly with the elevated voltage. The primary capacitor would thus be the impedance element of the voltage divider which "sees" the full elevated voltage on its input side. This direct electrical connection may be established through the engagement portion of the high voltage electrode and the connection element of the separable connector.

The expressions "directly electrically connected" and "direct electrical connection" as used herein refer to a fully conductive electrical connection between two elements, e.g. via a wire or via a conductive path on a PCB or via a conductive element, without any intermediate electrical component such as a resistor, a capacitor or an inductor, being arranged electrically between the two elements.

The sensored insulation plug according to the present disclosure can be inserted into a separable connector or other electrical connection device or termination designed to accommodate a basic insulating plug to monitor elevated voltage of said device that is part of a power distribution network of a national grid comprising a high voltage and/or medium-voltage power cables that are connected with a separable connector or other connection device. The present disclosure, therefore, provides a separable connector 10 arranged at an end of a medium-voltage power cable 20 wherein the separable connector comprises a connection element 80 for conducting power on elevated voltage, a rear cavity 70 and a sensored insulation plug 100, 200 as described herein, inserted into the rear cavity, wherein the high voltage electrode is electrically connected with the connection element as illustrated in FIG. 2. The separable connector 10 is arranged at an end of a medium-voltage power cable 20 and connects, via a bushing 40, the power-carrying central conductor 50 of the cable 20 to a MV switchgear 30 in a power distribution network of a national grid.

The separable connector 10 of FIG. 2 is a T-shaped separable connector that comprises a front cavity 60 for receiving the bushing 40 connected to switchgear 30, and a rear cavity 70 for receiving an insulation plug of a matching shape. The insulation plug may be a traditional insulation plug without a sensor or a sensored insulation plug 100, 200, according to the present disclosure, shown to the right of the rear cavity 70 in FIG. 2, before being inserted into the rear cavity 70. A traditional insulation plug and a sensored insulation plug 100, 200 according to the present disclosure both serve to electrically insulate a connection element 80 of the separable connector 10, which is electrically connected to the central conductor 50 of the cable 20 and can be electrically and mechanically connected to a conductive component of the bushing 40 via a threaded stud 90. In use, the connection element 80 is on the elevated voltage of the central conductor 50 of the cable.

Various modifications of the primary capacitor and the sensored insulation plug comprising the exemplary primary capacitor of the present invention may be readily apparent to those of skill in the art to which the present invention is directed upon review of the present specification. The accompanying claims and their equivalents are intended to cover such forms or modifications as would fall within the scope and spirit of the disclosure.

EXAMPLES

Unless otherwise noted, all parts, percentages, ratios, etc. in the Examples and the rest of the specification are by volume.

Materials

| Abbreviation | Description |
| --- | --- |
| SL-glass | Lime Glass beads 100-600 μm by Weissker GmbH, Greiz, Germany |
| LZT | Yellow Glass Beads with 61% $TiO_2$, 29% $La_2O_3$, 8% $ZrO_2$, 2% ZnO by wt., prepared as described in U.S. Pat. No. 7,579,293, incorporated herein by reference. |
| Epoxy | EPIKOTE 807, EPIKURE 866 and Catalyst 03832 (100:80:3) epoxy resin available from Hexion, (Duisburg, Germany). |

Test Methods

The samples were placed in a climate chamber and cycled from −20° C. to +60° C. while being energized at 1000 volts primary voltage. A 100 nF capacitor placed outside of the climate chamber was used as low voltage portion of the voltage divider. The voltage drop across the 100 nF capacitor was taken as a measure for the capacity of the sample.

Determining Temperature Coefficient of Capacitance (TCC)

The temperature of the climate chamber is then cycled between −20° C. and +60° C. at a rate of 1° K/min., and at every 5° C. a measurement of the secondary voltage and the temperature is recorded by a data logger. TCC is taken as the slope of the capacitance versus temperature and is shown in Table 1.

Sample Preparation

The epoxy was combined with the filler material(s) in a Hauschild V600 speedmixer as prescribed in Table 1. Each sample was mixed at 2350 rpm for 5 minutes at 5 mbar and 60° C. until the filler material(s) was homogeneously dispersed in the epoxy matrix material to yield a dielectric material mixture.

Each dielectric material mixture was cast into the test body mold with the high voltage and measurement electrodes were prepositioned in the mold for the test body in a Huebers lab vacuum casting machine. After casting, the dielectric material was crosslinked at 130° C. for 1 hour under a pressure of 3.5 bar. The test body was the basic insulating plug (BIP) mold with two electrodes, as to create a defined and reproducible electrical field.

TABLE 1

Dielectric Material Sample Compositions and Properties

| Example | Epoxy (Vol. %) | $SiO_2$ (Vol. %) | LZT (Vol. %) | SL glass (Vol. %) | $BaTiO_3$ (Vol. %) | $Al_2O_3$ (Vol. %) | MgO (Vol. %) | Viscosity at 60° C. (mPas) | TCC (ppm/K) |
| --- | --- | --- | --- | --- | --- | --- | --- | --- | --- |
| Ex. 1 | 55 | 0 | 45 | 0 | 0 | 0 | 0 | <2000 | 120 |
| CE. 1 | 50 | 30 | 20 | 0 | 0 | 0 | 0 | <2000 | 170 |
| CE. 2 | 70 | 0 | 0 | 30 | | | | >2000 | 1430 |

Dielectric material mixtures with higher viscosity than 2000 mPas could not be cast into the test body mold. Instead, the dielectric material was poured out onto a metal plate. The dielectric material was squeezed between two metal plates with a spacer of 1 mm to form 1 mm thick sample plate of the dielectric material. After crosslinking, each side of the dielectric material plate was coated to form an electrode so as to form a capacitor. The conductive coating used was a Carbon-conductive Ink (SD 2842 HAL) available from Lackwerke Peters GmbH & Co. KG (Kempen, Germany).

Figure 3:
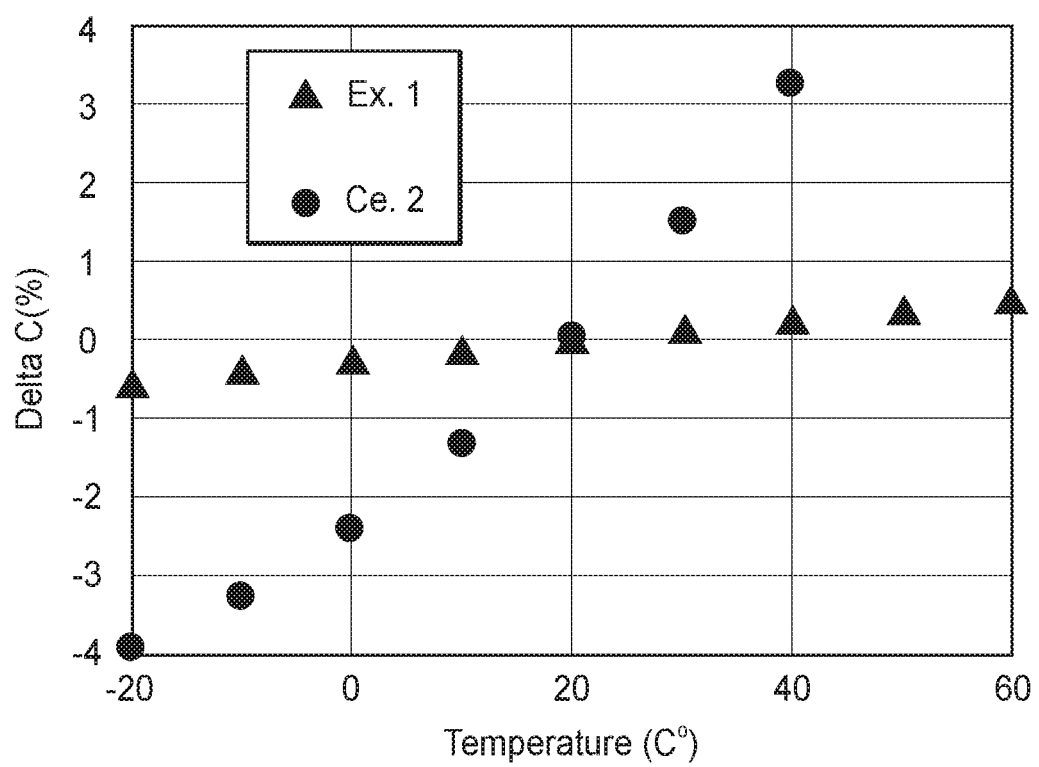
FIG. 3 is a graph showing the change in capacitance with temperature of the dielectric materials of Examples EX. 1 and comparative example CE. 2.

FIG. 3 shows the percent change in capacitance (Delta C) with temperature relative to the capacitance at 25° C. of the dielectric material of Example Ex. 1 and comparative example CE. 2. Example Ex. 1 has a less than +/−0.5% percent change in capacitance in the temperature range of −20° C. to 60° C., while the dielectric material made with the soda lime glass has a greater than +/−4% percent change in capacitance in the temperature range of −20° C. to 60° C.

What is claimed is:

1. A high voltage capacitor for a voltage divider that is configured to sense an elevated voltage for medium and high voltage electrical distribution networks, the high voltage capacitor comprising:
   a high voltage electrode;
   a measurement electrode; and
   a dielectric material consisting essentially of:
      a lanthanum oxide-zirconium oxide-titanium oxide glass filler, and
      an insulating polymer matrix,
      wherein the lanthanum oxide-zirconium oxide-titanium oxide glass filler is disposed in the insulating polymer matrix such that the dielectric material is characterized by a capacitance that does not vary by more than +/−0.5% in the temperature range of −20° C. to 60° C.,
      wherein the insulating polymer matrix is present in an amount of about 40 vol. % to about 70 vol. %, and the lanthanum oxide-zirconium oxide-titanium oxide glass filler is present in an amount of about 30 vol. % to about 60 vol. % within the dielectric material,
   wherein the dielectric material is disposed between the high voltage electrode and the measurement electrode.

2. The high voltage capacitor of claim 1, that the capacitance of the dielectric material does not vary by more than +/−0.2% in the temperature range of −20° C. to 60° C.

3. The high voltage capacitor of claim 1, wherein insulating polymer matrix comprises an epoxy resin matrix.

4. The high voltage capacitor of claim 1, wherein the dielectric material has a temperature coefficient of capacitance that is less than 125 ppm/K.

5. A sensor comprising:
   a voltage divider comprising:
      a high voltage capacitor of claim 1, and
      a low voltage capacitor,
      the high voltage capacitor and the low voltage capacitor connected in series; and
   an insulating polymer body,
      wherein the voltage divider is encapsulated in an insulating polymer body.

6. The sensor of claim 5, wherein the insulating polymer body consists of a dielectric material.

7. The sensor of claim 5, wherein the insulating polymer body has a generally truncated conical shape.

8. A voltage sensing device comprising a high voltage capacitor of claim 1.

9. A cable accessory for use with a high-voltage power cable in a power network, a medium-voltage power cable in a power network, or a combination thereof, the cable accessory comprising a voltage sensing device of claim 8.

* * * * *